(12) United States Patent
Hayashi (10) Patent No.: US 11,538,962 B2
(45) Date of Patent: Dec. 27, 2022

(54) LIGHT-EMITTING ELEMENT AND METHOD FOR MANUFACTURING LIGHT-EMITTING ELEMENT

(71) Applicant: NICHIA CORPORATION, Anan (JP)

(72) Inventor: Seiichi Hayashi, Anan (JP)

(73) Assignee: NICHIA CORPORATION, Anan (JP)

( * ) Notice: Subject to any disclaimer, the term of this patent is extended or adjusted under 35 U.S.C. 154(b) by 293 days.

(21) Appl. No.: 16/844,167

(22) Filed: Apr. 9, 2020

(65) Prior Publication Data

US 2020/0343412 A1    Oct. 29, 2020

(30) Foreign Application Priority Data

Apr. 23, 2019 (JP) .............................. JP2019-081497
Mar. 23, 2020 (JP) .............................. JP2020-050778

(51) Int. Cl.
| | | |
|---|---|---|
| *H01L 33/04* | (2010.01) |
| *H01L 33/32* | (2010.01) |
| *H01L 33/00* | (2010.01) |
| *H01L 33/20* | (2010.01) |

(52) U.S. Cl.
CPC ........ *H01L 33/325* (2013.01); *H01L 33/0075* (2013.01); *H01L 33/20* (2013.01)

(58) Field of Classification Search
CPC ....................................................... H01L 33/04
USPC ....................................................... 257/101
See application file for complete search history.

(56) References Cited

U.S. PATENT DOCUMENTS

| | | |
|---|---|---|
| 2004/0066816 A1 | 4/2004 | Collins et al. |
| 2010/0207100 A1 | 8/2010 | Strassburg et al. |
| 2013/0015465 A1 | 1/2013 | Lee |
| 2013/0270514 A1 | 10/2013 | Saxler |
| 2021/0280631 A1* | 9/2021 | Kang ................ H01L 27/153 |

FOREIGN PATENT DOCUMENTS

| | | |
|---|---|---|
| JP | 2004-128502 A | 4/2004 |
| JP | 2004-179369 A | 6/2004 |
| JP | 2008-078297 A | 4/2008 |
| JP | 2010-532926 A | 10/2010 |
| JP | 2013-021334 A | 1/2013 |

\* cited by examiner

*Primary Examiner* — Hsin Yi Hsieh
(74) *Attorney, Agent, or Firm* — Foley & Lardner LLP (57) ABSTRACT

A light-emitting element includes: a first n-type nitride semiconductor layer; a first light-emitting layer located on the first n-type nitride semiconductor layer; a p-type GaN layer located on the first light-emitting layer; an n-type GaN layer located on the p-type GaN layer and doped with an n-type impurity at an impurity concentration higher than that of the first n-type nitride semiconductor layer; a non-doped GaN layer located between the p-type GaN layer and the n-type GaN layer, a thickness of the non-doped GaN layer being not more than a width of a depletion layer formed by the n-type and p-type GaN layers; a second n-type nitride semiconductor layer located on the n-type GaN layer and doped with an n-type impurity; a second light-emitting layer located on the second n-type nitride semiconductor layer; and a p-type nitride semiconductor layer located on the second light-emitting layer and doped with a p-type impurity.

12 Claims, 9 Drawing Sheets

LIGHT-EMITTING ELEMENT AND METHOD FOR MANUFACTURING LIGHT-EMITTING ELEMENT

CROSS-REFERENCE TO RELATED APPLICATIONS

This application claims priority to Japanese Patent Application No. 2019-081497, filed on Apr. 23, 2019, and Japanese Patent Application No. 2020-050778, filed on Mar. 23, 2020, the disclosures of which are hereby incorporated by reference in their entireties.

BACKGROUND

The present disclosure relates to a light-emitting element and a method for manufacturing a light-emitting element.

Japanese Patent Publication No. 2008-78297 discusses a light-emitting element in which a tunnel junction between p-type GaN doped with a p-type impurity at a high concentration and an n-type GaN layer doped with an n-type impurity at a high concentration is included in a semiconductor stacked structure of nitride semiconductors. It is desirable to further reduce the drive voltage of such a light-emitting element.

SUMMARY

The present disclosure describes a light-emitting element and a method for manufacturing a light-emitting element in which the drive voltage can be reduced while forming a tunnel junction in a semiconductor stacked structure of nitride semiconductors.

According to one embodiment, a light-emitting element includes a first n-type nitride semiconductor layer doped with an n-type impurity; a first light-emitting layer provided on the first n-type nitride semiconductor layer; a p-type GaN layer provided on the first light-emitting layer and doped with a p-type impurity; an n-type GaN layer provided on the p-type GaN layer and doped with an n-type impurity at a higher impurity concentration than the first n-type nitride semiconductor layer; a non-doped GaN layer provided between the p-type GaN layer and the n-type GaN layer, a thickness of the non-doped GaN layer being not more than a width of a depletion layer formed by the n-type GaN layer and the p-type GaN layer; a second n-type nitride semiconductor layer provided on the n-type GaN layer and doped with an n-type impurity; a second light-emitting layer provided on the second n-type nitride semiconductor layer; and a p-type nitride semiconductor layer provided on the second light-emitting layer and doped with a p-type impurity.

According to another embodiment, a method for manufacturing a light-emitting element includes: forming a first n-type nitride semiconductor layer doped with an n-type impurity; forming a first light-emitting layer on the first n-type nitride semiconductor layer; forming, on the first light-emitting layer, the p-type GaN layer doped with a p-type impurity; forming, on the p-type GaN layer, an intermediate layer including a non-doped GaN layer; forming, on the intermediate layer, an n-type GaN layer doped with an n-type impurity at a higher impurity concentration than the first n-type nitride semiconductor layer; forming, on the n-type GaN layer, a second n-type nitride semiconductor layer doped with an n-type impurity; forming a second light-emitting layer on the second n-type nitride semiconductor layer; and forming, on the second light-emitting layer, a p-type nitride semiconductor layer doped with a p-type impurity, the intermediate layer being formed to have a thickness not more than a width of a depletion layer formed by the n-type GaN layer and the p-type GaN layer.

According to certain embodiments of the present disclosure, the drive voltage can be reduced while forming a tunnel junction in a semiconductor stacked structure of nitride semiconductors.

DETAILED DESCRIPTION

Embodiments will now be described with reference to the drawings. The same components in the drawings are labeled with the same reference numerals.

Figure 1:
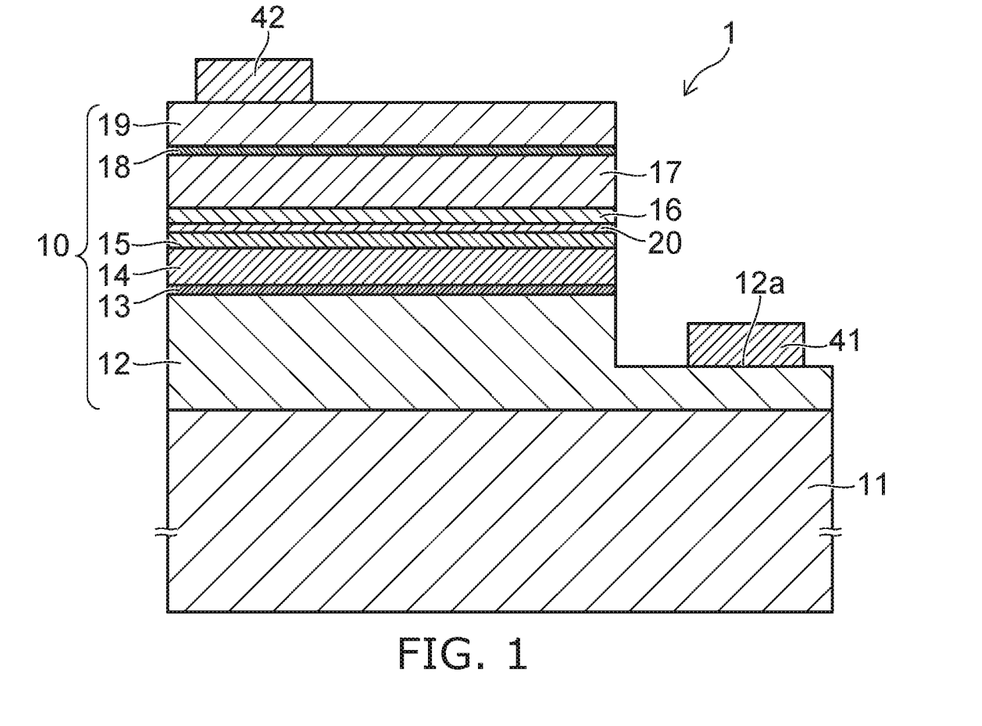
FIG. 1 is a schematic cross-sectional view of a light-emitting element of an embodiment of the present invention.

FIG. 1 is a schematic cross-sectional view of a light-emitting element of an embodiment of the present invention.

As shown in FIG. 1, the light-emitting element 1 of the embodiment includes a substrate 11, a semiconductor stacked body 10 provided on the substrate 11, an n-side electrode 41, and a p-side electrode 42.

The semiconductor stacked body 10 is a stacked body in which multiple semiconductor layers made of nitride semiconductors are stacked. In the specification, "nitride semiconductor" includes all compositions of semiconductors of the chemical formula $In_xAl_yGa_{1-x-y}N$ ($0 \leq x \leq 1$, $0 \leq y \leq 1$, and $x+y \leq 1$) for which the composition ratios x and y are within the respective ranges.

For example, the semiconductor stacked body 10 may be epitaxially grown on the substrate 11 by MOCVD (metal organic chemical vapor deposition). The material of the substrate 11 may be, for example, sapphire, silicon, SiC, GaN, etc.

The semiconductor stacked body 10 includes a first n-type nitride semiconductor layer 12, a first light-emitting layer 13, a first p-type nitride semiconductor layer 14, a p-type GaN layer 15, an intermediate layer 20, an n-type GaN layer 16, a second n-type nitride semiconductor layer 17, a second light-emitting layer 18, and a second p-type nitride semiconductor layer 19 in order from the substrate 11 side.

The first n-type nitride semiconductor layer 12, the first light-emitting layer 13, the first p-type nitride semiconductor layer 14, the p-type GaN layer 15, the intermediate layer 20, the n-type GaN layer 16, the second n-type nitride semiconductor layer 17, the second light-emitting layer 18, and the second p-type nitride semiconductor layer 19 are epitaxially grown in order on the substrate 11.

The first n-type nitride semiconductor layer 12, the n-type GaN layer 16, and the second n-type nitride semiconductor layer 17 may be doped with, for example, silicon (Si) as an n-type impurity. The n-type impurity concentration of the n-type GaN layer 16 is higher than the n-type impurity concentration of the first n-type nitride semiconductor layer 12 and the n-type impurity concentration of the second n-type nitride semiconductor layer 17. These concentrations are set to obtain a tunnel effect between the p-type GaN layer 15 and the n-type GaN layer 16. The gradient of the potential at the depletion layer formed by the n-type GaN layer 16 and the p-type GaN layer 15 can be set to be steep by setting the n-type impurity concentration to be high. For example, when the n-type impurity concentration of the n-type GaN layer 16 is set to an n-type impurity concentration similar to that of the first n-type nitride semiconductor layer 12, it is difficult to set the gradient of the potential at the depletion layer formed by the n-type GaN layer 16 and the p-type GaN layer 15 to be steep, and a sufficient tunnel effect cannot be obtained.

The first p-type nitride semiconductor layer 14, the p-type GaN layer 15, and the second p-type nitride semiconductor layer 19 may be doped with, for example, magnesium (Mg) as a p-type impurity.

The p-side electrode 42 is disposed on the second p-type nitride semiconductor layer 19, and the p-side electrode 42 is connected electrically to the second p-type nitride semiconductor layer 19.

The first n-type nitride semiconductor layer 12 has an n-contact surface 12a where the first light-emitting layer 13, the first p-type nitride semiconductor layer 14, the p-type GaN layer 15, the intermediate layer 20, the n-type GaN layer 16, the second n-type nitride semiconductor layer 17, the second light-emitting layer 18, and the second p-type nitride semiconductor layer 19 are not stacked. The n-side electrode 41 is disposed on the n-contact surface 12a, and the n-side electrode 41 is connected electrically to the first n-type nitride semiconductor layer 12.

Figure 2:
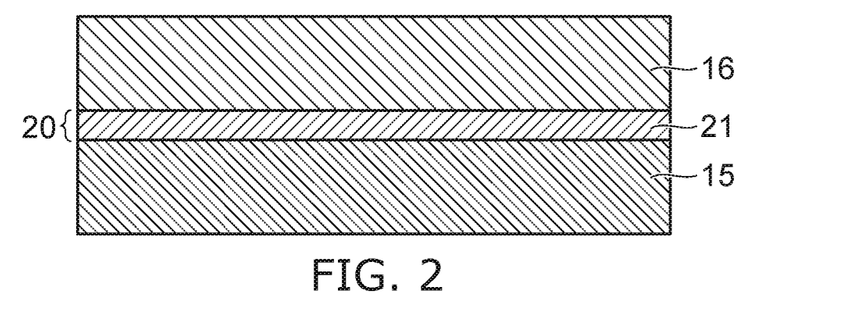
FIG. 2 is a schematic enlarged cross-sectional view of a portion of the light-emitting element shown in FIG. 1 where a p-type GaN layer, an intermediate layer, and an n-type GaN layer are stacked.

FIG. 2 is a schematic enlarged cross-sectional view of a portion of the light-emitting element 1 shown in FIG. 1 where the p-type GaN layer 15, the intermediate layer 20, and the n-type GaN layer 16 are stacked.

The intermediate layer 20 includes at least a non-doped GaN layer 21. In the example shown in FIG. 2, the intermediate layer 20 includes the non-doped GaN layer 21. The non-doped GaN layer 21 is provided between the p-type GaN layer 15 and the n-type GaN layer 16.

Herein, a non-doped layer is a layer formed without using a source gas (e.g., a gas including Si and/or Mg) for intentionally doping an impurity to control the conductivity, but there are cases where an impurity may be included due to inevitable mixing due to the processes. For example, the impurity concentration of the non-doped GaN layer 21 may be $1\times10^{18}/cm^3$ or less.

A positive potential is applied to the p-side electrode 42, and a negative potential is applied to the n-side electrode 41. In such a case, a forward voltage is applied between the second p-type nitride semiconductor layer 19 and the n-type GaN layer 16, and the second light-emitting layer 18 emits light due to holes and electrons supplied to the second light-emitting layer 18. A forward voltage is also applied between the p-type GaN layer 15 and the first n-type nitride semiconductor layer 12, and the first light-emitting layer 13 emits light due to holes and electrons supplied to the first light-emitting layer 13.

The light emission peak wavelength of the first light-emitting layer 13 and the light emission peak wavelength of the second light-emitting layer 18 may be, for example, not less than about 430 nm and not more than about 540 nm, and blue light and/or green light is emitted. Compared to a light-emitting element in which one light-emitting layer is provided, the output can be increased by stacking the first light-emitting layer 13 and the second light-emitting layer 18. The light emission peak wavelengths of the first light-emitting layer 13 and the second light-emitting layer 18 may be different from each other.

When the positive potential is applied to the p-side electrode 42 and the negative potential is applied to the n-side electrode 41, a reverse voltage is applied between the n-type GaN layer 16 and the p-type GaN layer 15. Therefore, the current between the n-type GaN layer 16 and the p-type GaN layer 15 utilizes the tunnel effect. That is, the current flows due to the movement of electrons from the valence band of the p-type GaN layer 15 into the conduction band of the n-type GaN layer 16 due to tunneling through the barrier between the n-type GaN layer 16 and the p-type GaN layer 15.

Figure 4:
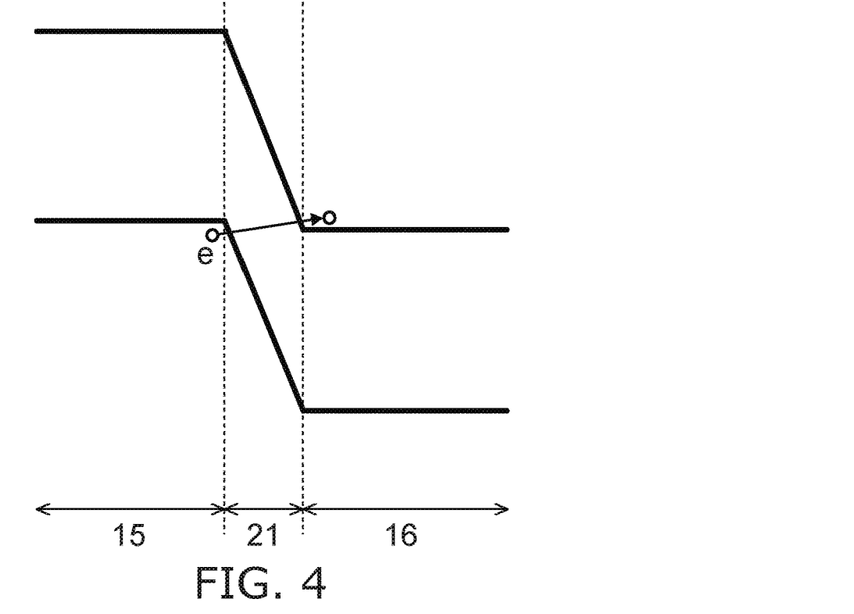
FIG. 4 is a schematic energy band diagram of the stacked part shown in FIG. 2.

FIG. 4 is a schematic energy band diagram of the stacked part shown in FIG. 2.

A p-n junction is formed by the n-type GaN layer 16 doped with an n-type impurity at a high concentration and the p-type GaN layer 15 doped with a p-type impurity at a high concentration. The gradient of the potential at the depletion layer formed by the n-type GaN layer 16 and the p-type GaN layer 15 is set to be steep, and the width of the depletion layer is set to be narrow. With such a configuration, electrons e of the valence band of the p-type GaN layer 15 can move into the conduction band of the n-type GaN layer 16 by tunneling through the depletion layer (the potential barrier).

For example, the Si concentration of the n-type GaN layer 16 including Si as an impurity may be not less than $1\times10^{20}/cm^3$ and not more than $1\times10^{21}/cm^3$. The Mg concentration of the p-type GaN layer 15 including Mg as an impurity is not less than $1\times10^{20}/cm^3$ and not more than $1\times10^{21}/cm^3$. The width of the depletion layer formed by such an n-type GaN layer 16 and such a p-type GaN layer 15 may be, for example, not less than 7 nm and not more than 8 nm.

The thickness of the non-doped GaN layer 21 is not more than the width of the depletion layer formed by the n-type GaN layer 16 and the p-type GaN layer 15, and may be, for example, not less than 3 nm and not more than 5 nm.

FIGS. 6 through 15 are schematic cross-sectional views showing a method for manufacturing the light-emitting element 1 shown in FIG. 1. For example, the layers described above may be epitaxially grown on the substrate 11 by MOCVD (metal organic chemical vapor deposition).

Figure 6:
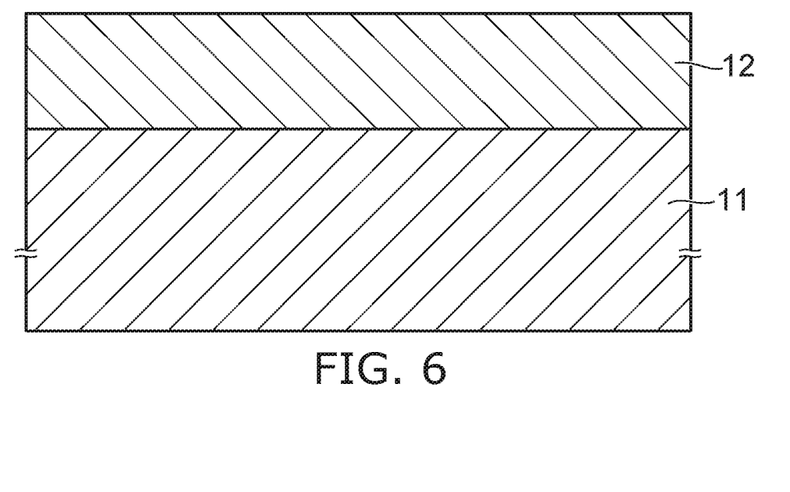
FIGS. 6 through 15 are schematic cross-sectional views showing a method for manufacturing the light-emitting element shown in FIG. 1.
Figure 7:
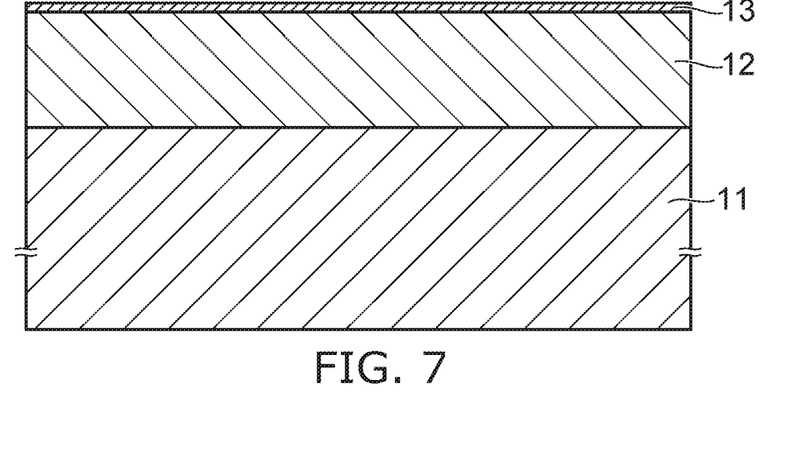
Figure 8:
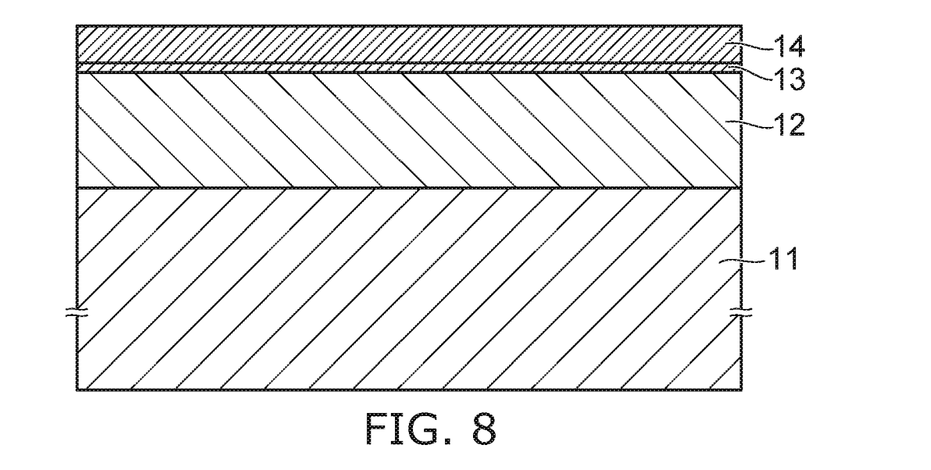
Figure 9:
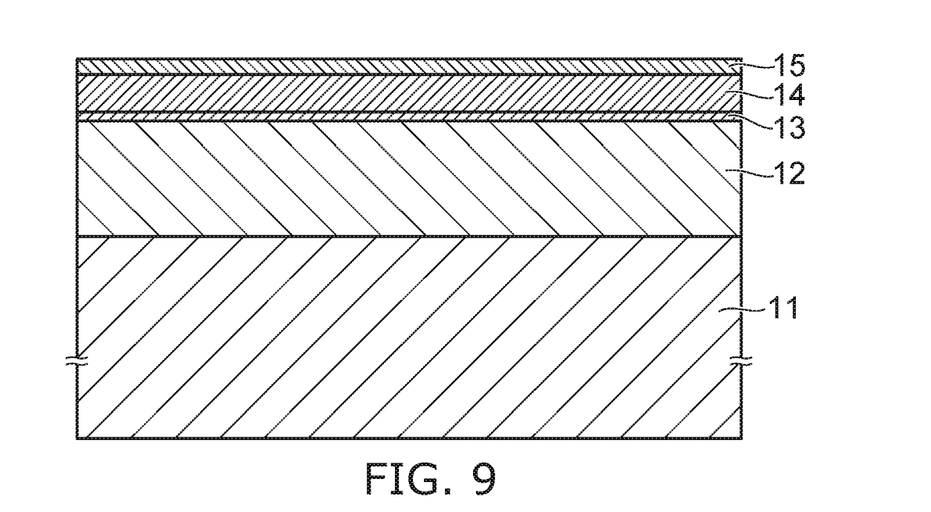
Figure 10:
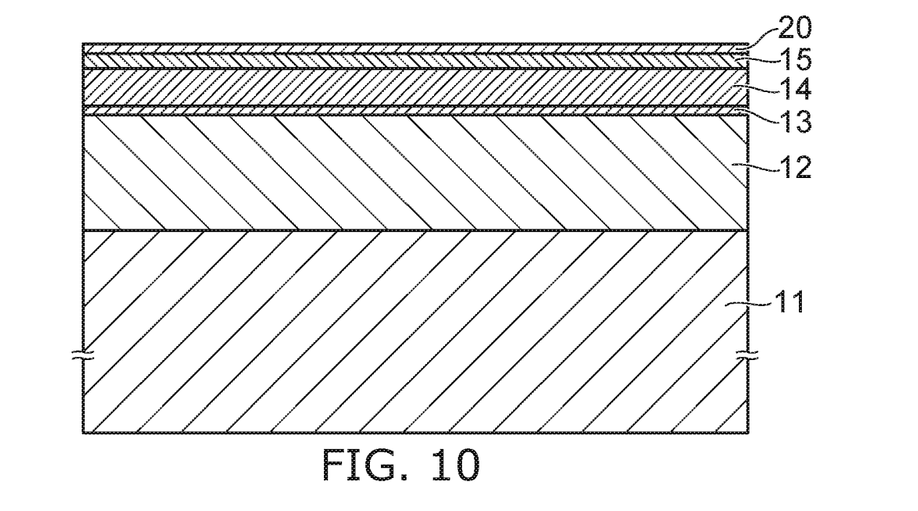
Figure 11:
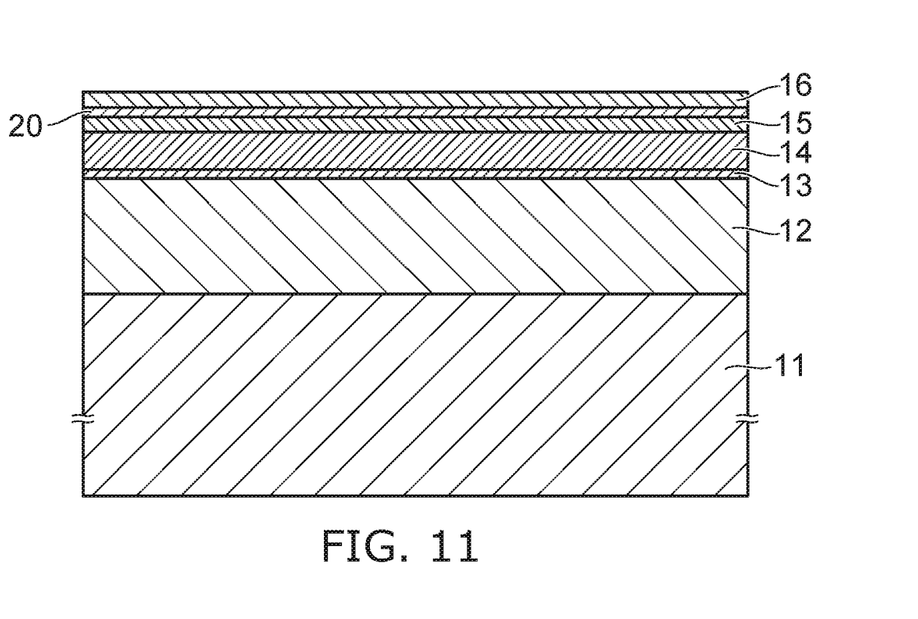
Figure 12:
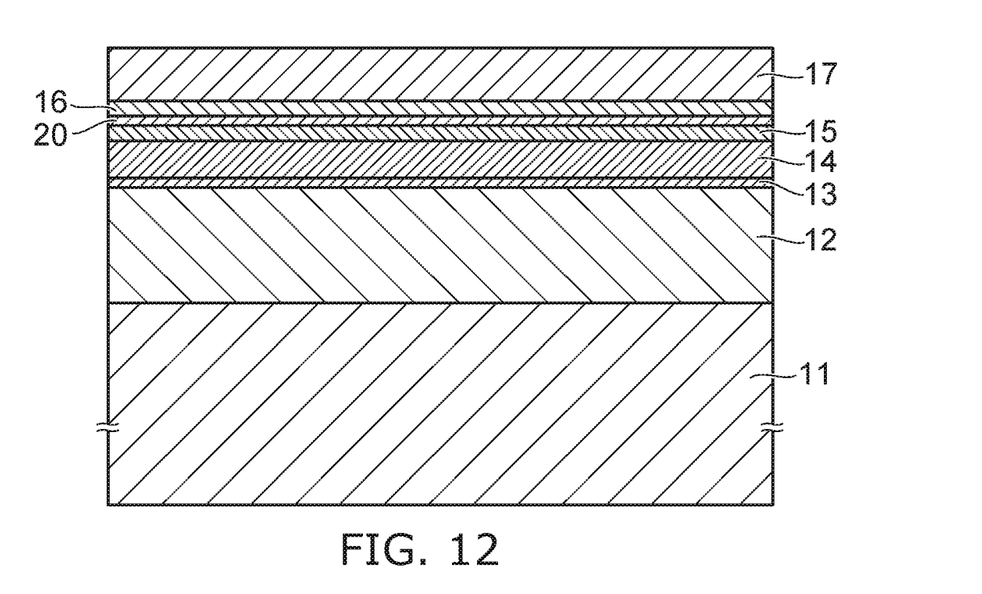
Figure 13:
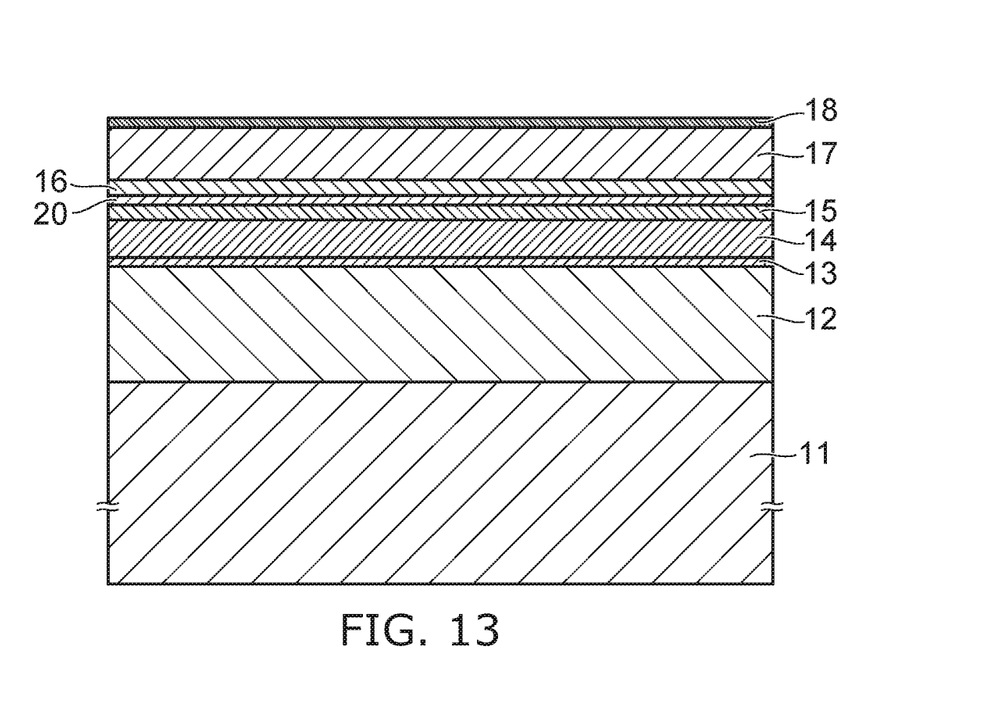
Figure 14:
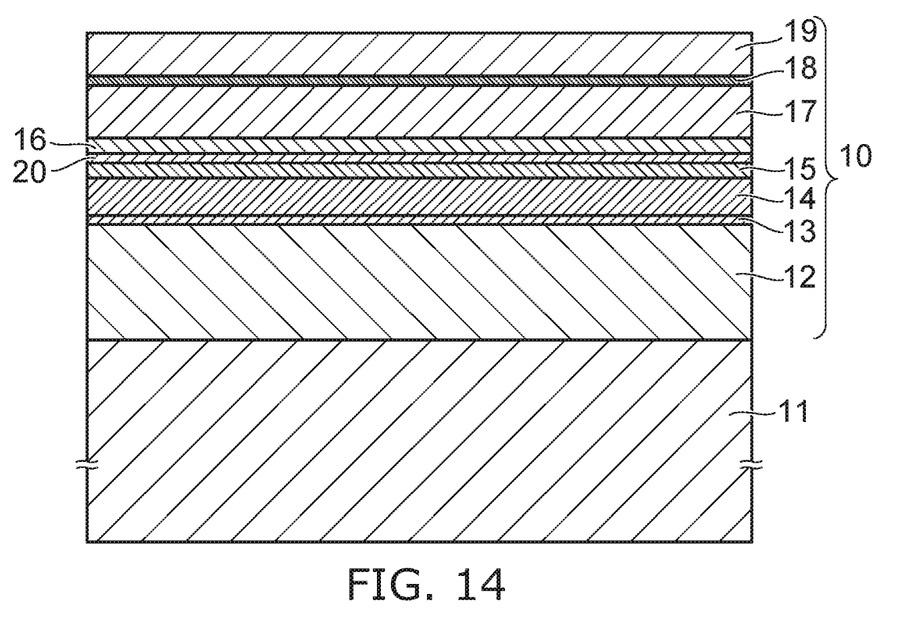

First, as shown in FIG. 6, the first n-type nitride semiconductor layer 12 is formed on the substrate 11. As shown in FIG. 7, the first light-emitting layer 13 is formed on the first n-type nitride semiconductor layer 12. As shown in FIG. 8, the first p-type nitride semiconductor layer 14 is formed on the first light-emitting layer 13. As shown in FIG. 9, the p-type GaN layer 15 is formed on the first p-type nitride semiconductor layer 14. As shown in FIG. 10, the intermediate layer 20 is formed on the p-type GaN layer 15. As shown in FIG. 11, the n-type GaN layer 16 is formed on the intermediate layer 20. As shown in FIG. 12, the second n-type nitride semiconductor layer 17 is formed on the n-type GaN layer 16. As shown in FIG. 13, the second light-emitting layer 18 is formed on the second n-type nitride semiconductor layer 17. As shown in FIG. 14, the second p-type nitride semiconductor layer 19 is formed on the second light-emitting layer 18. Thus, the semiconductor stacked body 10 is formed on the substrate 11.

Figure 15:
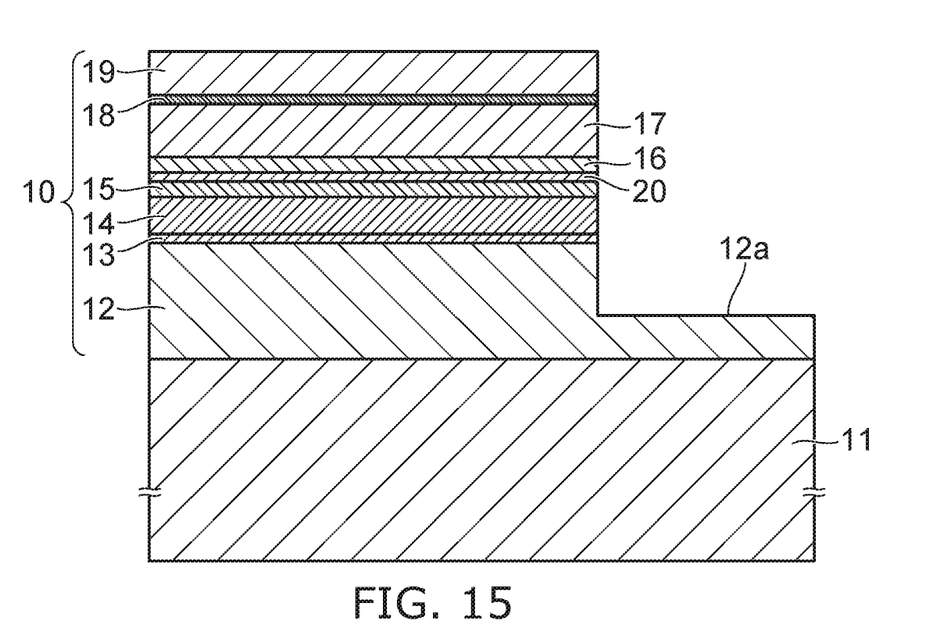

Subsequently, a portion of the semiconductor stacked body 10 formed on the substrate 11 is removed, and the n-contact surface 12a is exposed as a portion of the first n-type nitride semiconductor layer 12 as shown in FIG. 15.

Subsequently, as shown in FIG. 1, the p-side electrode 42 is formed on the second p-type nitride semiconductor layer 19, and the n-side electrode 41 is formed on the n-contact surface 12a.

Example 1

A light-emitting element according to Example 1 was made as described below.

The first n-type nitride semiconductor layer 12 was formed on the substrate 11. A substrate made of sapphire was used as the substrate 11. A nitride semiconductor layer that had a film thickness of about 10 μm and included a non-doped GaN layer and a GaN layer including Si as an impurity was formed as the first n-type nitride semiconductor layer 12.

A multi-quantum well layer that included multiple well layers and multiple barrier layers was formed as the first light-emitting layer 13 on the first n-type nitride semiconductor layer 12. The well layer was made of a non-doped InGaN layer having a film thickness of 3.6 nm. The barrier layer was made of a non-doped GaN layer having a film thickness of 4.3 nm. Nine pairs were formed, each including the well layer and the barrier layer.

A nitride semiconductor layer that had a film thickness of about 50 nm and included a GaN layer including Mg as an impurity was formed as the first p-type nitride semiconductor layer 14 on the first light-emitting layer 13.

Then, about 17 nm of a GaN layer having an impurity concentration of Mg of about $1 \times 10^{20}/cm^3$ was formed as the p-type GaN layer 15 on the first p-type nitride semiconductor layer 14. Subsequently, the heating temperature of the wafer including the substrate 11 and the nitride semiconductor layers on the substrate 11 was reduced. Purging was performed to remove the gas including Mg remaining inside the chamber. Subsequently, the wafer was extracted from the chamber. Subsequently, the wafer was returned to the chamber and heated, and 3 nm of the non-doped GaN layer 21 was formed on the p-type GaN layer 15. The heating temperature of the wafer was increased further, and a GaN layer that had a film thickness of about 30 nm and an impurity concentration of Si of about $1 \times 10^{20}/cm^3$ was formed as the n-type GaN layer 16 on the non-doped GaN layer 21. A GaN layer that included Si as an impurity and had a film thickness of about 100 nm was formed as the second n-type nitride semiconductor layer 17 on the n-type GaN layer 16. The stacked structure of the p-type GaN layer 15, the n-type GaN layer 16, and the non-doped GaN layer 21 in Example 1 was similar to the stacked structure shown in FIG. 2.

Example 2

A light-emitting element according to Example 2 was made similarly to Example 1, except that the film thickness of the non-doped GaN layer 21 was formed to be 5 nm, a.

Example 3

A light-emitting element according to Example 3 was made similarly to Example 1, except that the film thickness of the non-doped GaN layer 21 was formed to be 1 nm.

For the light-emitting elements according to Examples 1 to 3 thus made, a voltage was applied between the first n-type nitride semiconductor layer 12 and the second n-type nitride semiconductor layer 17, and the drive voltage was measured.

Comparative Example

A light-emitting element according to a Comparative Example was made similarly to Example 1, except that the non-doped GaN layer 21 was not formed and the n-type GaN layer 16 was formed directly on the p-type GaN layer 15. For the light-emitting element according to the Comparative Example, similarly to the light-emitting elements according to the Examples, a voltage was applied between the first n-type nitride semiconductor layer 12 and the second n-type nitride semiconductor layer 17, and the drive voltage was measured.

For the light-emitting element according to Example 1, the drive voltage necessary to cause a forward current of 65 mA to flow was not more than 7 V. For the light-emitting element according to Example 2, the drive voltage necessary to cause a forward current of 65 mA to flow was not more than 7 V and was slightly higher than that of Example 1. For the light-emitting element according to Example 3, the drive voltage necessary to cause a forward current of 65 mA to flow was not less than 7 V, and was lower than the drive voltage of the light-emitting element according to the Comparative Example but higher than those of Examples 1 and 2. For the light-emitting element according to the Comparative Example, the drive voltage necessary to cause a forward current of 65 mA to flow was not less than 8 V.

It was confirmed from these results that compared to the light-emitting element according to the Comparative Example, the drive voltage can be reduced by forming the n-type GaN layer 16 after forming the non-doped GaN layer 21 on the p-type GaN layer 15 as in the light-emitting elements according to Examples 1 to 3. Also, it can be estimated from the results of the light-emitting elements according to Examples 1 to 3 that by using the structure of the embodiment, a light-emitting element that has an equivalent output but uses a voltage lower than that of the light-emitting element according to the Comparative Example can be obtained.

When forming the semiconductor stacked body 10 including two light-emitting layers utilizing the tunnel effect as in the light-emitting element of the embodiment, the p-type GaN layer 15 undergoes thermal damage easily due to the cooling process and/or the heating process described above after forming the p-type GaN layer 15. The crystallinity of the p-type GaN layer 15 may degrade due to such thermal damage. If the crystallinity of the p-type GaN layer 15 that is used as the foundation when forming the n-type GaN layer 16 degrades, the crystallinity of the n-type GaN layer 16 also degrades, which causes the drive voltage of the light-emitting element to increase.

According to the embodiment, by forming the non-doped GaN layer 21 on the p-type GaN layer 15 directly before forming the n-type GaN layer 16, the n-type GaN layer 16 can be formed in a state in which the effects of the crystallinity of the p-type GaN layer 15 are reduced. Therefore, the degradation of the crystallinity of the n-type GaN layer 16 can be suppressed. As a result, according to the embodiment, the drive voltage of the light-emitting element can be reduced compared to the case where the non-doped GaN layer 21 is not formed on the p-type GaN layer 15.

By forming the non-doped GaN layer 21 to have a thickness not more than the width of the depletion layer formed by the p-type GaN layer 15 and the n-type GaN layer 16, the tunneling of the electrons from the valence band of the p-type GaN layer 15 into the conduction band of the n-type GaN layer 16 is possible while suppressing the increase of the depletion layer width due to the formation of the non-doped GaN layer 21.

Figure 3:
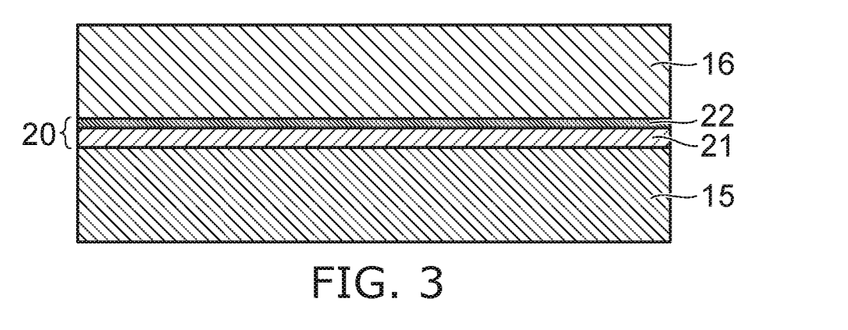
FIG. 3 is a schematic enlarged cross-sectional view showing another embodiment of the portion of the light-emitting element shown in FIG. 1 where the p-type GaN layer, the intermediate layer, and the n-type GaN layer are stacked.

FIG. 3 is a schematic enlarged cross-sectional view showing another embodiment of the portion of the light-emitting element 1 shown in FIG. 1 where the p-type GaN layer 15, the intermediate layer 20, and the n-type GaN layer 16 are stacked.

Figure 5:
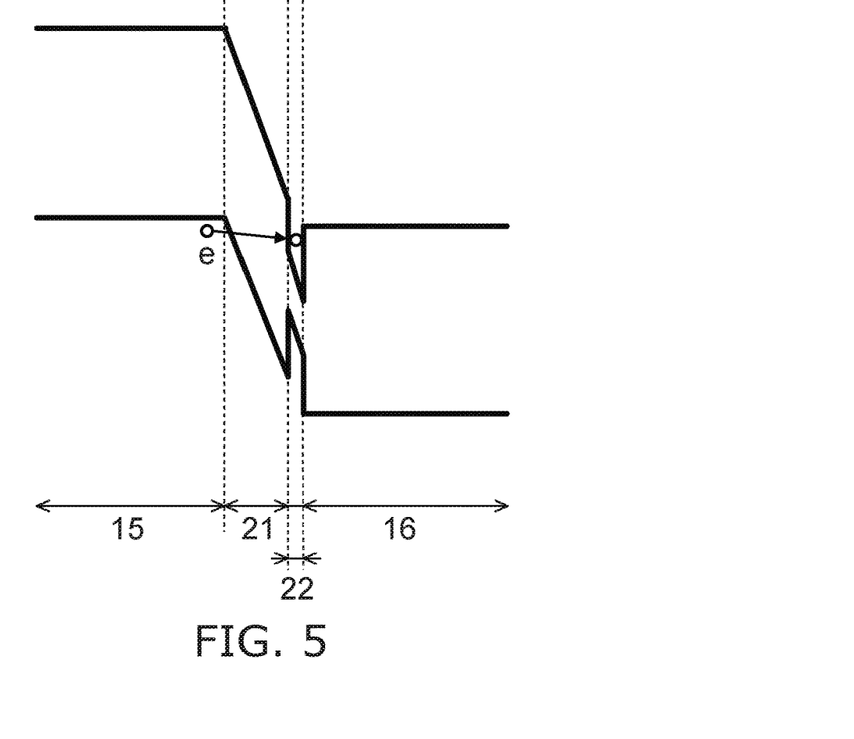
FIG. 5 is a schematic energy band diagram of the stacked part shown in FIG. 3.

FIG. 5 is a schematic energy band diagram of the stacked part shown in FIG. 3.

In this example, the intermediate layer 20 includes the non-doped GaN layer 21 and a non-doped InGaN layer 22. The non-doped InGaN layer 22 is provided between the n-type GaN layer 16 and the non-doped GaN layer 21. The non-doped GaN layer 21 is provided between the non-doped InGaN layer 22 and the p-type GaN layer 15.

The thickness of the non-doped GaN layer 21 is greater than the thickness of the non-doped InGaN layer 22. The total of the thickness of the non-doped GaN layer 21 and thickness of the non-doped InGaN layer 22—i.e., the thickness of the intermediate layer 20—is not more than the width of the depletion layer formed by the p-type GaN layer 15 and the n-type GaN layer 16.

The thickness of the non-doped GaN layer 21 is not less than 3 nm and not more than 5 nm, and the thickness of the non-doped InGaN layer 22 is not less than 3 nm and not more than 5 nm.

The non-doped InGaN layer 22 that has a smaller bandgap than the non-doped GaN layer 21 is provided between the p-type GaN layer 15 and the n-type GaN layer 16. Therefore, compared to the structure of FIG. 4, in which only the non-doped GaN layer 21 is provided as the intermediate layer 20, the depletion layer width that is the barrier when the electrons e of the valence band of the p-type GaN layer 15 tunnel into the conduction band of the n-type GaN layer 16 can be narrow as shown in FIG. 5. Therefore, according to the intermediate layer 20 including the non-doped GaN layer 21 and the non-doped InGaN layer 22 shown in FIG. 5, the tunnel effect occurs more easily than in the structure of FIG. 4, and the drive voltage can be reduced.

It is favorable for the thickness of the non-doped GaN layer 21 to be greater than the thickness of the non-doped InGaN layer 22 because there is a tendency for the crystallinity of InGaN layer to be worse than that of GaN layer.

The non-doped InGaN layer 22, which has a tendency to have crystallinity worse than that of the non-doped GaN layer 21, easily causes the crystallinity of the non-doped InGaN layer 22 to be inherited by the non-doped GaN layer 21 if the non-doped InGaN layer 22 is formed on the p-type GaN layer 15 first and the non-doped GaN layer 21 is formed on the non-doped InGaN layer 22. Therefore, it is favorable to form the non-doped GaN layer 21 first on the p-type GaN layer 15 and to form the non-doped InGaN layer 22 on the non-doped GaN layer 21. By using such a configuration, the degradation of the crystallinity of the layer used as the foundation when forming the n-type GaN layer 16 can be reduced compared to the case where the non-doped GaN layer 21 is formed after forming the non-doped InGaN layer 22.

Figure 16:
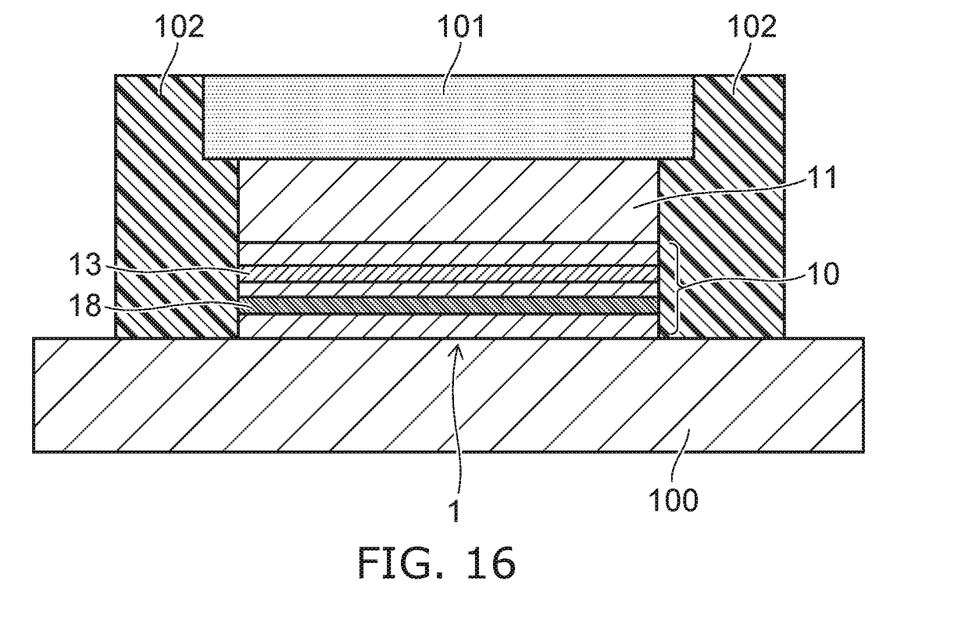
FIG. 16 shows an example of a light-emitting device in which the light-emitting element of the embodiment of the present invention is used.

FIG. 16 shows an example of a light-emitting device in which the light-emitting element 1 of the embodiment of the present invention is used.

The light-emitting element 1 of the embodiment described above is mounted to wiring electrodes, etc., formed on a mounting substrate 100. The semiconductor stacked body 10 is provided between the mounting substrate 100 and the substrate 11 of the light-emitting element 1. A wavelength conversion member 101 is provided on the substrate 11. For example, the wavelength conversion member 101 may include a sintered body including a fluorescer, etc. A light-reflective resin layer 102 is formed to cover the side surfaces of the light-emitting element 1 and the wavelength conversion member 101. The first light-emitting layer 13 and the second light-emitting layer 18 are exposed at the side surface of the light-emitting element 1, and the side surfaces of the first light-emitting layer 13 and the second light-emitting layer 18 are covered with the resin layer 102. Light-reflective particles are included in the resin layer 102. Aluminum oxide, titanium oxide, etc., can be used as such Light-reflective particles. The light from the light-emitting element 1 mainly is extracted from the upper surface side of the wavelength conversion member 101 not covered with the resin layer 102.

Because the light-emitting element 1 of the embodiment of the present invention includes the two light-emitting layers of the first light-emitting layer 13 and the second light-emitting layer 18 in the semiconductor stacked body 10, the output per unit area can be high compared to a light-emitting element including one light-emitting layer. Accordingly, by using the light-emitting element 1 of the embodiment of the present disclosure, a light-emitting device that has a high output per unit area can be obtained.

In the embodiments of the present disclosure described above, the n-type GaN layer 16 is described as GaN layer doped with n-type impurity, but the n-type GaN layer 16 may be used as an InGaN layer or an AlGaN layer that contain a minim Indium or Aluminum. In the embodiments of the present disclosure described above, the p-type GaN layer 15 is described as GaN layer doped with p-type impurity, but the p-type GaN layer 15 may be used as an InGaN layer or an AlGaN layer that contain a minim Indium or Aluminum. Containing a minim Indium or Aluminum in the GaN layer means that Indium and Aluminum are contained in the GaN layer at a mixed crystal ratio of 0.1% or less.

Embodiments of the present invention have been described with reference to specific examples. However, the present invention is not limited to these specific examples. Based on the above-described embodiments of the present invention, all embodiments that can be implemented with appropriately design modification by one skilled in the art are also within the scope of the present invention as long as the gist of the present invention is included. Further, one skilled in the art can conceive various modifications within the spirit of the present invention, and such modifications should be considered to fall within the scope of the present invention.

What is claimed is:
1. A light-emitting element comprising:
a first n-type nitride semiconductor layer doped with an n-type impurity;
a first light-emitting layer located on the first n-type nitride semiconductor layer;
a p-type GaN layer located on the first light-emitting layer and doped with a p-type impurity;
an n-type GaN layer located on the p-type GaN layer and doped with an n-type impurity, wherein an impurity concentration of the n-type impurity of the n-type GaN layer is higher than an impurity concentration of the n-type impurity of the first n-type nitride semiconductor layer;

a non-doped GaN layer located between the p-type GaN layer and the n-type GaN layer;

a second n-type nitride semiconductor layer located on the n-type GaN layer and doped with an n-type impurity;

a second light-emitting layer located on the second n-type nitride semiconductor layer;

a p-type nitride semiconductor layer located on the second light-emitting layer and doped with a p-type impurity; and a non-doped InGaN layer located between the non-doped GaN layer and the n-type GaN layer, wherein a tunnel junction is formed between the p-type GaN layer and the n-type GaN layer.

2. The element according to claim 1, wherein a thickness of the non-doped GaN layer is greater than a thickness of the non-doped InGaN layer.

3. The element according to claim 1, wherein a thickness of the non-doped InGaN layer is not less than 3 nm and not more than 5 nm.

4. The element according to claim 2, wherein the thickness of the non-doped InGaN layer is not less than 3 nm and not more than 5 nm.

5. The element according to claim 1, wherein a thickness of the non-doped GaN layer is not less than 3 nm and not more than 5 nm.

6. The element according to claim 2, wherein the thickness of the non-doped GaN layer is not less than 3 nm and not more than 5 nm.

7. A method for manufacturing a light-emitting element, the method comprising:

forming a first n-type nitride semiconductor layer doped with an n-type impurity;

forming, on the first n-type nitride semiconductor layer, a first light-emitting layer;

forming, on the first light-emitting layer, a p-type GaN layer doped with a p-type impurity;

forming, on the p-type GaN layer, an intermediate layer comprising a non-doped GaN layer and a non-doped InGaN layer;

forming, on the intermediate layer, an n-type GaN layer doped with an n-type impurity, wherein an impurity concentration of the n-type impurity of the n-type GaN layer is higher than an impurity concentration of the n-type impurity of the first n-type nitride semiconductor layer;

forming, on the n-type GaN layer, a second n-type nitride semiconductor layer doped with an n-type impurity;

forming, on the second n-type nitride semiconductor layer, a second light-emitting layer; and forming, on the second light-emitting layer, a p-type nitride semiconductor layer doped with a p-type impurity;

wherein the non-doped InGaN layer is located between the non-doped GaN layer and the n-type GaN layer, wherein a tunnel junction is formed between the p-type GaN layer and the n-type GaN layer.

8. The method according to claim 7, wherein a thickness of the non-doped GaN layer is greater than a thickness of the non-doped InGaN layer.

9. The method according to claim 7, wherein a thickness of the non-doped InGaN layer is not less than 3 nm and not more than 5 nm.

10. The method according to claim 8, wherein the thickness of the non-doped InGaN layer is not less than 3 nm and not more than 5 nm.

11. The method according to claim 7, wherein a thickness of the non-doped GaN layer is not less than 3 nm and not more than 5 nm.

12. The method according to claim 8, wherein the thickness of the non-doped GaN layer is not less than 3 nm and not more than 5 nm.

* * * * *